United States Patent [19]

Chipalkatti et al.

[11] Patent Number: 5,336,370

[45] Date of Patent: Aug. 9, 1994

US005336370A

[54] PRE-TREATMENT FOR PLATING TECHNIQUE

[76] Inventors: Makarand H. Chipalkatti, 6 Fiske Rd., Lexington, Mass. 02173; Elizabeth A. Trickett, 20 Francine Rd., Framingham, Mass. 01701

[21] Appl. No.: 165,051

[22] Filed: Dec. 9, 1993

[51] Int. Cl.$^5$ .............................. B44C 1/22
[52] U.S. Cl. ......................... 156/668; 156/654; 252/79.2; 427/307; 427/306
[58] Field of Search ............. 156/654, 655, 668, 902; 252/79.2; 427/304, 305, 306, 307; 134/26, 28, 29, 30; 204/80

[56] References Cited

U.S. PATENT DOCUMENTS

| | | | |
|---|---|---|---|
| 4,374,709 | 2/1983 | Combs | 204/30 |
| 4,448,836 | 5/1984 | Gatzschmann et al. | 156/668 X |
| 4,457,951 | 7/1984 | D'Amico et al. | 156/668 X |
| 4,560,445 | 12/1985 | Hoover et al. | 204/15 |
| 4,576,685 | 3/1986 | Goffredo et al. | 204/30 |
| 4,748,056 | 5/1988 | Nuzzi et al. | 427/304 |
| 4,775,449 | 10/1988 | Dumas et al. | 204/30 |
| 4,775,557 | 10/1988 | Bastenbeck et al. | 427/307 |

FOREIGN PATENT DOCUMENTS 0272420  5/1987  European Pat. Off. .

Primary Examiner—William Powell
Attorney, Agent, or Firm—William H. McNeill

[57] ABSTRACT

A method of preparing an electrically insulating polymer substrate, particularly those containing an aromatic group, for the reception of an electrically conductive pattern, said substrate having a glass transition temperature or a softening temperature, comprises the steps of: performing a first cleaning of the substrate; heating the substrate in a nitrogen atmosphere for about 3 hours at a temperature of about 20° C. below the glass transition temperature or the softening temperature of the substrate; cooling the substrate to room temperature; roughening the surface of the substrate by, for example, etching said substrate in a chromic acid-containing solution for about 3 minutes at a temperature of between 65° C. and 70° C.; and performing a second cleaning and drying of the substrate.

9 Claims, No Drawings

PRE-TREATMENT FOR PLATING TECHNIQUE

TECHNICAL FIELD

This invention relates to plating electrically conductive patterns on electrically insulating substrates and more particularly to a pre-treatment for such substrates.

BACKGROUND ART

The plating of metallized patterns on electrically insulating substrates is known as attested to by the existence of numerous polymer metallization techniques. See, for example, U.S. Pat. Nos. 4,374,709; 4,560,445; 4,576,685. In spite of these examples, however, the metal-polymer interfacial chemistry is not well understood. The surfaces of two identically prepared samples of a polymer will be different if stored in different conditions of temperature and humidity. The surface condition will also relate to the molding method, stress, local temperature and humidity during the molding process, as well as the inherent porosity of the polymer. Consequently, the polymer-metal adhesion can vary on seemingly identically prepared polymer products. A machined flat surface, plated immediately after machining, presents an ideal surface for reproducible metallization. However, typically, the molded polymer part on which it is desired to plate will have a curved molded surface making machining impractical. Additionally, such parts are often stored for varying lengths of time prior to plating. It is also known to pre-treat materials, particularly plastic materials, to enhance their receptability of the plating materials. See, for example, U.S. Pat. Nos. 4,748,056; 4,775,449; and published EP Patent Application No. 0 272 420 (application no. 87116339.0). Surface treatment immediately before metallization is essential in order to render all surfaces chemically equivalent and to achieve reproducible results. Pretreatments do work to a greater or lesser degree. For example, fine sand blasting prior to, and/or instead of, chromic acid etching, gives somewhat more uniform results; but, the surface quality of the subsequent copper plates is likely to mirror the "rough" blasted surface. In addition, the sand blasting procedure is difficult to standardize. Pretreatment by air plasma (glow discharge), is also a useful replacement for etching, but, again, reproducibility of plating quality is not assured by plasma treatment alone.

It would, therefore, be an advance in the art to provide a pretreatment that would allow high quality, reproducible plating on polymers.

It is believed that this can be accomplished by providing the polymer parts to be plated with, as nearly as possible, identical pristine surfaces, similar to that of the aforementioned machined polymer surface. The time necessary for electroless plating has been found to vary from sample to sample. In some cases, areas will plate rapidly and begin to blister before other areas begin to plate. It is known that polymers retain molding induced stresses and that the surfaces may not be identical either physically or chemically. This variability may explain the differing plating results.

DISCLOSURE OF THE INVENTION

It is, therefore, an object of this invention to obviate the disadvantages of the prior art.

It is another object of the invention to provide a pre-treatment of electrically insulating materials that enhances the electroless plating of metals thereon.

These objects are carried out, in one aspect of the invention, by the provision of a method of preparing an electrically insulating polymer substrate for the reception of an electrically conductive pattern, the substrate having a glass transition temperature or a softening temperature, by heating the substrate in a nitrogen atmosphere for about 3 hours at a temperature of about 20° C. below the glass transition temperature or the softening temperature of the substrate.

After the heat treatment additional adhesion promoting steps can include cooling the substrate to room temperature; roughening the surface of the substrate; and performing a second cleaning and drying of the substrate.

The heat treatment greatly enhances the ability of the plastic to receive the conductive pattern in a reproducible manner.

BEST MODE FOR CARRYING OUT THE INVENTION

For a better understanding of the present invention, together with other and further objects, advantages and capabilities thereof, reference is made to the following disclosure and appended claims.

Referring now to the invention with greater particularity, a suitable electrically insulating polymer substrate, such as those containing aromatic groups, e.g., polycarbonates, polyetherimides, polystyrene and assorted copolymers and blends such as those bearing the tradenames ABS (an acrylonitrile styrene acrylate terpolymer), Noryl (a polystyrene p-phenylene oxide copolymer), ASA (an acrylonitrile styrene acrylate terpolymer), and PMMA or acrylic (a poly (methyl methacrylate)), is first treated by cleaning thoroughly in a liquid soap solution and then rinsing in deionized water and drying in a nitrogen gas stream. In a preferred embodiment the liquid soap can an all purpose cleaner such as a 2% solution of Micro ®, manufactured by International Products Corporation. The soap employed is not critical so long as it removes dust, grease and fingerprints and rinses cleanly.

The cleaned polymer substrate is then heat treated in a nitrogen atmosphere for several hours. If the polymer is non-crystalline, the temperature should be about 20° C. below its glass transition (Tg) temperature. This glass transition temperature is not easily discerned. In an amorphous (non-crystalline) polymer the material softens over a wide temperature range and the change is not abrupt or distinctly apparent. The so-called "book values" for Tg are a result of plotting properties such as specific volume against temperature and recording the change in the slope. As will be apparent, this temperature is not precise and varies from batch to batch; the temperature for any specific material is found by a data interpretation and experimentation on the polymer in question. In the preferred embodiment of this invention the material is an ABS terpolymer and the Tg lies between 91° C. and 110° C.

Crystalline polymers do not necessarily have a Tg and, when they are used, the heating temperature should be about 20° C. below the softening temperature.

In either case the point is to heat the material as high as possible without causing heat deformation.

In the case of an ABS terpolymer, this heating temperature is about 80° C. and a suitable time is about three (3) hours, after which the substrate is cooled to room temperature, i.e. about 22° C.

The cooled substrate can then be provided with additional adhesion promoting steps by, for example, acid-etching in a solution containing chromic acid for about three (3) to seven (7) minutes; fine sand blasting; or providing an air plasma treatment.

In the case of acid-etching, a suitable etching bath may be made by adding 450 mL of deionized water to a 4 L beaker and placing the beaker in a large water bath. 127.4 g $CrO_3$ is added and dissolved with stirring. 54.6 g oxalic acid is added slowly, keeping the temperature below 60° C. Deionized water is then added to bring the total volume to 910 mL. An additional 872.6 g $CrO_3$ is added and dissolved with stirring, after which the water bath is heated to 65° C. for one (1) hour with cooling for about ten (10) hours. The water bath is then heated to 68° C. for three (3) hours, raised to 71° C. for four (4) hours, and then cooled to room temperature, i.e., about 22° C. After room temperature is reached, 245 mL of sulfuric acid is added slowly and then deionized water is added to bring the total solution volume to 1.82 L.

This solution can be used many times to etch different plastic parts. It can be renewed by using fresh $CrO_3$. It is not necessary to add oxalic acid, which is only added to weaken the intense oxidizing power of fresh $CrO_3$.

After the etching, the substrate is rinsed in deionized water and dried in a nitrogen gas stream.

The pre-treated substrate is now ready to be plated. While many techniques are available, the technique shown in the above-mentioned EP published patent no. 0 272 420 has been shown to be efficacious and the teachings of this publication, not being essential to the practice of the invention described and claimed herein, are hereby incorporated by reference.

It is believed that this pretreatment involving heating the polymer substrate immediately before cleaning renders all surfaces equal prior to etching, at least partially by removing stress from the parts. Performance of this invention has been shown to affect the surface of the parts such that the level of etching normally observed after 5 minutes was accomplished in 3 minutes and subsequent plating was of improved quality and the results were reproducible.

While there have been shown and described what are at present considered to be the preferred embodiments of the invention, it will be apparent to those skilled in the art that various changes and modifications can be made herein without departing from the scope of the invention as defined by the appended claims.

What is claimed is:

1. A method of preparing an electrically insulating polymer substrate for the reception of an electrically conductive pattern, said substrate having a glass transition temperature or a softening temperature, comprising the steps of:
    a) performing a first cleaning of said substrate;
    b) heating said substrate in a nitrogen atmosphere for about 3 hours at a temperature of about 20° C. below said glass transition temperature or said softening temperature of said substrate;
    c) cooling said substrate to room temperature;
    d) roughening said substrate; and
    e) performing a second cleaning and drying of said substrate.

2. The method of claim 1 wherein said glass transition temperature is about 100° C.

3. The method of claim 1 wherein said first cleaning comprises washing said substrate in liquid soap; rinsing in deionized water; and drying in a nitrogen gas stream.

4. The method of claim 1 wherein said roughening comprises etching said substrate in a chromic acid-containing solution for about 3 minutes at a temperature of between 65° C. and 70° C.

5. The method of claim 1 wherein said chromic acid solution contains oxalic acid.

6. The method of claim 1 wherein said second cleaning comprises rinsing in deionized water; and drying in a nitrogen gas stream.

7. The method of claim 1 wherein said electrically insulating substrate is selected from the group consisting of polymers containing aromatic groups.

8. The method of claim 4 wherein said etching bath is at a temperature of 67° C.

9. A method of preparing an electrically insulating polymer substrate for the reception of an electrically conductive pattern, said substrate having a glass transition temperature, or a softening temperature, comprising:

heating said substrate in a nitrogen atmosphere for about 3 hours at a temperature of about 20° C. below said glass transition temperature or said softening temperature of said substrate; and
subsequently applying said conductive pattern.

* * * * *